(12) United States Patent
Hastings et al.

(10) Patent No.: US 7,068,205 B1
(45) Date of Patent: Jun. 27, 2006

(54) CIRCUIT, METHOD, AND APPARATUS FOR CONTINUOUSLY VARIABLE ANALOG TO DIGITAL CONVERSION

(75) Inventors: Mark E. Hastings, Mukilteo, WA (US); David Van Ess, Arlington, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/874,779

(22) Filed: Jun. 22, 2004

(51) Int. Cl.
*H03M 1/34* (2006.01)
*H03M 5/08* (2006.01)

(52) U.S. Cl. ........................ 341/164; 341/53

(58) Field of Classification Search ............... 341/53, 341/155, 157, 131, 120, 118, 164; 327/172; 330/10; 375/219, 238; 712/244
See application file for complete search history.

(56) References Cited

U.S. PATENT DOCUMENTS

| | | | | |
|---|---|---|---|---|
| 5,502,440 A | * | 3/1996 | New ........................ | 341/157 |
| 5,559,467 A | * | 9/1996 | Smedley ................... | 330/10 |
| 6,150,963 A | * | 11/2000 | Boscolo et al. ........... | 341/53 |
| 6,279,108 B1 | * | 8/2001 | Squires et al. ........... | 712/244 |
| 6,445,326 B1 | * | 9/2002 | Donovan et al. .......... | 341/155 |
| 6,504,863 B1 | * | 1/2003 | Hellmark .................. | 375/219 |
| 6,545,624 B1 | * | 4/2003 | Lee et al. ................. | 341/155 |
| 6,674,387 B1 | * | 1/2004 | Ott ........................... | 341/155 |
| 6,686,860 B1 | * | 2/2004 | Gulati et al. ............. | 341/155 |
| 6,784,710 B1 | * | 8/2004 | Andersen et al. ......... | 327/172 |
| 6,895,046 B1 | * | 5/2005 | Willis et al. .............. | 375/238 |

* cited by examiner

*Primary Examiner*—Patrick Wamsley

(57) ABSTRACT

A circuit, method and microcontroller apparatus for performing an analog to digital conversion with continuously variable resolution is disclosed. The circuit includes a integrating modulator for converting an analog input signal, corresponding to an input voltage, to a digital signal at its output over an integrate time. The circuit also includes a counter with an enable input coupled to the integrating modulator output. The counter accumulates the number of cycles where the digital signal is positive during the sample period and provides a corresponding conversion result. Further, the circuit has a pulse width modulator; its output gates a clock to the counter enable input. The pulse width modulator is user programmable on-the-fly to set said integrate time and said sample period.

14 Claims, 9 Drawing Sheets

CIRCUIT, METHOD, AND APPARATUS FOR CONTINUOUSLY VARIABLE ANALOG TO DIGITAL CONVERSION

TECHNICAL FIELD

The present invention relates generally to the field of analog to digital conversion. More specifically, embodiments of the present invention relate to a circuit, method, and apparatus for continuously variable analog to digital conversion.

BACKGROUND

Analog to digital converters convert continuously varying analog signals into digital signals, such as binary code readable by processors, computers and other digital devices and systems. Analog to digital (A/D) conversion is useful for allowing the many kinds of continuously variable analog signals that characterize diverse real world phenomena, such as alternating current electricity, temperature, pressure, light and other radiation, sound, movement, and a wide variety of many others, to be converted into a form that can be read and processed by computers. This allows computerized monitoring, control, and other functions in response to the analog signals.

A modern analog to digital converter (ADC) may be deployed on an integrated circuit (IC). A single IC may deploy a single or multiple ADC circuits, and thus constitute a dedicated ADC device. With the miniaturization and functional capability inherent in some modern ICs, an ADC may constitute one circuit deployed thereon. One such modern IC is the microcontroller, which effectively constitutes a computer functionality on a single IC. Microcontrollers incorporate a processor, a clock, read only and random access memories, and an input/output (I/O) unit, integrated into a single chip. Some microcontrollers are user programmable.

Fixed counters characterize typical conventional ADCs. For some conventional ADCs, their full scale is fixed as well, and thus not adjustable. For other conventional ADCs, the full scale is adjustable. Typically however, for conventional ADCs that allow it, the full scale adjustment is adjustable in fixed powers of two, or as multiples of a minor conversion factor. Some conventional ADCs can be adjusted by varying a reference voltage thereto, which can for instance change the gain of the ADC allowing a known result for a given input voltage being converted. But whether a conventional ADC is adjustable or not, once set, its full scale count is not typically changeable.

Conventionally, ADCs are calibrated in one of two ways. Some conventional ADCs are calibrated by adjusting a reference voltage, which can for instance change the gain of the ADC, so as to achieve a specifically desired ADC result. On other conventional ADCs, the reference voltage remains fixed and a scaling factor is selected and applied to calculating the conversion result. Such scaling factors are typically a fixed or a floating point value by which an actual conversion result is multiplied or divided to achieve a scaled result. The scaling factor is scaled into each and every ADC result after the conversion.

Fixed scale conventional ADCs can be less convenient for some applications than adjustable scale conventional ADCs. Adjustable conventional ADCs must be manually calibrated, such as wherein the reference voltage is changed by manipulating a mechanically adjustable potentiometer. Further, the fixed powers of two based conversion result outputs characterizing some adjustable conventional ADCs can be inconvenient mathematically. Conversion result outputs characterizing other adjustable conventional ADCs that use multiples of fixed scaling factors can also be mathematically inconvenient. For instance, to handle the conversion result outputs of adjustable conventional ADCs, IC operations such as processing, memory usage, and the like, typically engage in fixed and/or floating point arithmetic.

Manual calibration (e.g., adjustment of the reference voltage with a potentiometer or similar mechanically or otherwise actuated electrical device) can be time consuming, labor intensive, error prone, and inefficient. The mathematically inconvenient conversion result of adjustable conventional ADCs can demand handling using fixed and/or floating point arithmetic. Fixed and floating point arithmetic operations typically make demands on processing and memory resources. Such demands can increase the time needed to calculate conversion results, which can increase the time needed to perform a conversion and reduce the sampling availability of the ADC. Such inefficiencies may thus characterize conventional ADCs, even those deployed on single ICs such as microcontrollers.

SUMMARY

What is needed is a way to perform analog to digital conversion that is readily applicable to digitally handling a wide variety of real world phenomena. What is also needed is a way to perform analog to digital conversion that does not require manual calibration. Further, what is needed is an analog to digital converter that outputs a mathematically convenient conversion result that does not require excessive fixed or floating point operations for handling, and which thus economizes on processing, memory, and other computational resources.

Accordingly, a circuit, method and microcontroller apparatus for performing an analog to digital conversion with continuously variable resolution is disclosed. The circuit, method and microcontroller apparatus perform analog to digital conversion that is readily applicable to digitally handling a wide variety of real world phenomena. The circuit, method and microcontroller apparatus also obviate manual reference voltage calibration to perform analog to digital conversion. Further, the circuit, method and microcontroller apparatus do not require excessive fixed or floating point operations for handling, and thus economize on processing, memory, and other computational resources.

A circuit, method and microcontroller apparatus for performing an analog to digital conversion with continuously variable resolution are disclosed. In one embodiment, a circuit for performing an analog to digital conversion with continuously variable resolution includes an integrating modulator for converting an analog input signal, corresponding to an input voltage, to a digital signal at its output over an integrate time. The circuit also includes a counter with an enable input coupled to the integrating modulator output. The counter accumulates the number of cycles where the digital signal is positive during the sample period and provides a corresponding conversion result. Further, the circuit has a pulse width modulator. The output of this pulse width modulator gates a clock to the counter enable input. The pulse width modulator is user programmable on-the-fly to set said integrate time and said sample period. In one embodiment, the circuit is configurable on-the-fly by programming components of a microcontroller.

DETAILED DESCRIPTION

Figure 1:
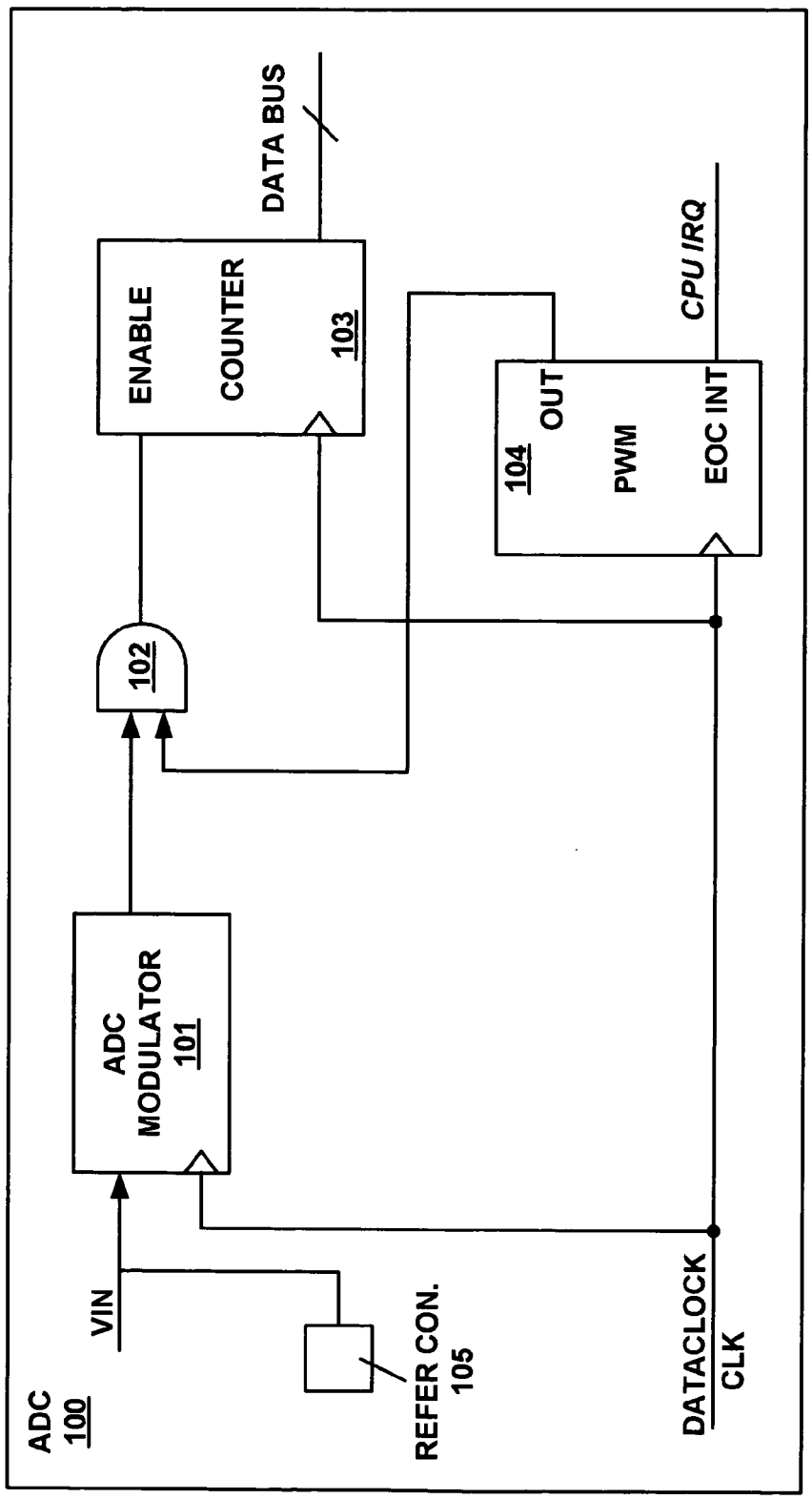
FIG. 1 depicts an exemplary analog to digital converter (ADC), according to one embodiment of the present invention.

A circuit, method and microcontroller apparatus for performing an analog to digital conversion with continuously variable resolution is disclosed. Reference is now made in detail to several embodiments of the invention, examples of which are illustrated in the accompanying drawing figures. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, one of ordinary skill in the art will realize that embodiments of the present invention may be practiced without these specific details. In other instances, well-known methods, processes, algorithms, procedures, networks, systems, components, and circuits have not been described in detail so as not to unnecessarily obscure aspects of the present invention.

Portions of the detailed description that follows are presented and discussed in terms of processes. Although steps and sequencing thereof are disclosed in figures herein (e.g., FIGS. 6 and 7) describing the operations of these processes (e.g., processes 600 and 700), such steps and sequencing are exemplary. Embodiments of the present invention are well suited to performing various other steps or variations of the steps recited in the flowcharts of the figures herein, and in a sequence other than that depicted and described herein. In one embodiment, such processes are carried out by processors and electrical and electronic components under the control of computer readable and computer executable instructions comprising code contained in a computer usable medium.

An embodiment of the present invention provides a circuit, method, and apparatus for performing an analog to digital conversion with continuously variable resolution. In one embodiment, a circuit for performing an analog to digital conversion with continuously variable resolution includes a integrating modulator for converting an analog input signal, corresponding to an input voltage, to a digital signal at its output over an integrate time. The circuit also includes a counter with an enable input coupled to the integrating modulator output. The counter accumulates the number of cycles where the digital signal is positive during the sample period and provides a corresponding conversion result. Further, the circuit has a pulse width modulator. The output of this pulse width modulator gates a clock to the counter enable input. The pulse width modulator is user programmable on-the-fly to set said integrate time and said sample period. In one embodiment, the circuit is configurable on-the-fly by programming components of a microcontroller.

Therefore, a way to perform analog to digital conversion that is readily applicable to digitally handling a wide variety of real world phenomena is achieved. A way is also achieved for performing analog to digital conversion that does not require manual reference voltage adjustment for calibration. Further, an analog to digital converter that outputs a mathematically convenient conversion result is achieved. The analog to digital converter disclosed herein requires significantly less fixed or floating point operations for handling its conversion result output than conventional analog to digital converters. Thus, the analog to digital converter disclosed herein economizes on processing, memory, and other computational resources. This economy is significant in comparison with the computational demands of conventional analog to digital converters in handling their conversion results.

An analog to digital converter of an embodiment of the present invention has the advantage of adjustability of sampling period to achieve the resolution needed for a given system, which can optimize performance. Further, an analog to digital converter of an embodiment of the present invention has the advantage of full scale selectability by characterization (e.g., programming on-the-fly), or calibration to mathematically convenient return values that can be handled without undue fixed or floating point arithmetic, which supports efficiency and economizes on computational resources.

Exemplary A/D Converters

Exemplary A/D Converter

FIG. 1 depicts an exemplary analog to digital converter (ADC) 100, according to one embodiment of the present invention. In one embodiment, ADC 100 may be an independent circuit. ADC 100 is configured in another embodiment from programmable elements of a processing apparatus such as a programmable microcontroller.

A voltage Vin is supplied to an analog to digital conversion (ADC) modulator 101, which is clocked by a data clock Clk. In one embodiment, ADC modulator 101 functions as an analog modulator for integrating input voltage Vin into a digital pulse stream output, which provides one input to an AND gate 102. In one embodiment, ADC modulator 101 comprises a switched capacitor.

ADC modulator 101 functions as an integrator for Vin with a reference feedback, provided in one embodiment by a reference control 105. Reference control 105 adds or subtracts a reference voltage Vref from the input voltage Vin to the integrator ADC modulator 101 so as to pull the digital pulse stream output of the integrator back towards analog ground. In one embodiment, Vref has a low component Vref− and a high component Vref+, wherein Vref− $\leq$ Vin $\leq$ Vref+.

Pulse width modulator (PWM) 104 controls the integrate time and the sample period. PWM 104 is clocked by data clock Clk. While the output of the PWM 104 is in a high state, the ADC 100 is in the integrate mode accumulating the result. When the PWM 104 output goes low, an End Of Conversion (EOC) interrupt signal provides an interrupt request IRQ, e.g., for a processor. When the output of the PWM 104 returns high, it drives one of the AND gate 102 outputs high. This allows the digital pulse output of ADC 101 to drive the input of the counter 103.

Counter 103 is clocked by data clock Clk and accumulates a result of each analog to digital conversion. Counter 103 is read at the end of the integrate time, e.g., as determined by PWM 104, to provide a result, e.g., to a data bus. During each sample period, counter 103 is enabled by PWM 104 through AND gate 102 to count each pulse of the digital pulse output of ADC modulator 101, which in one embodiment may be buffered.

PWM 104 functions as a timer for controlling the period ADC modulator 101 spends integrating and for controlling the period counter 103 accumulates the digital pulse output therefrom. The PWM period (e.g., compare value) can be changed, even on-the-fly; PWM 104 is adjustable on-the-fly to allow the sample period and the integrate time to be changed and independent of the data clock Clk. Allowing the sample period and integrate time to be adjustable on-the-fly by some integral number of clock pulses, the full scale value of ADC 100 may take advantage of adjustability.

The output of ADC modulator 101 is, in one embodiment, a function of the input voltage Vin and the reference voltage Vref. Where Vref has a low component Vref− and a high component Vref+, wherein Vref−≦Vin≦Vref+, the output of ADC modulator 101 is given by Equation 1, below.

$$Vresult = (Full\ Scale\ Value)(Vin - Vref)/2Vref \qquad \text{Equation 1}$$

The full scale value is adjustable to allow a user to adjust ADC 100 to a resolution required for a given application. In contrast to the fixed or relatively coarse full scale adjustments characteristic of conventional devices, ADC 100 provides continuously variable resolution wherein the full scale value can range from 1 to nearly $2^N$, where N is the bit size characterizing the PWM 104. The continuously variable resolution of ADC 100 can optimize the performance of systems in which it is deployed, obviates reference voltage calibration required by conventional devices, as well as processing intensive fixed and floating point operations conventionally required for scaling.

Exemplary A/D Converters with Multiple Integrators

Figure 2A:
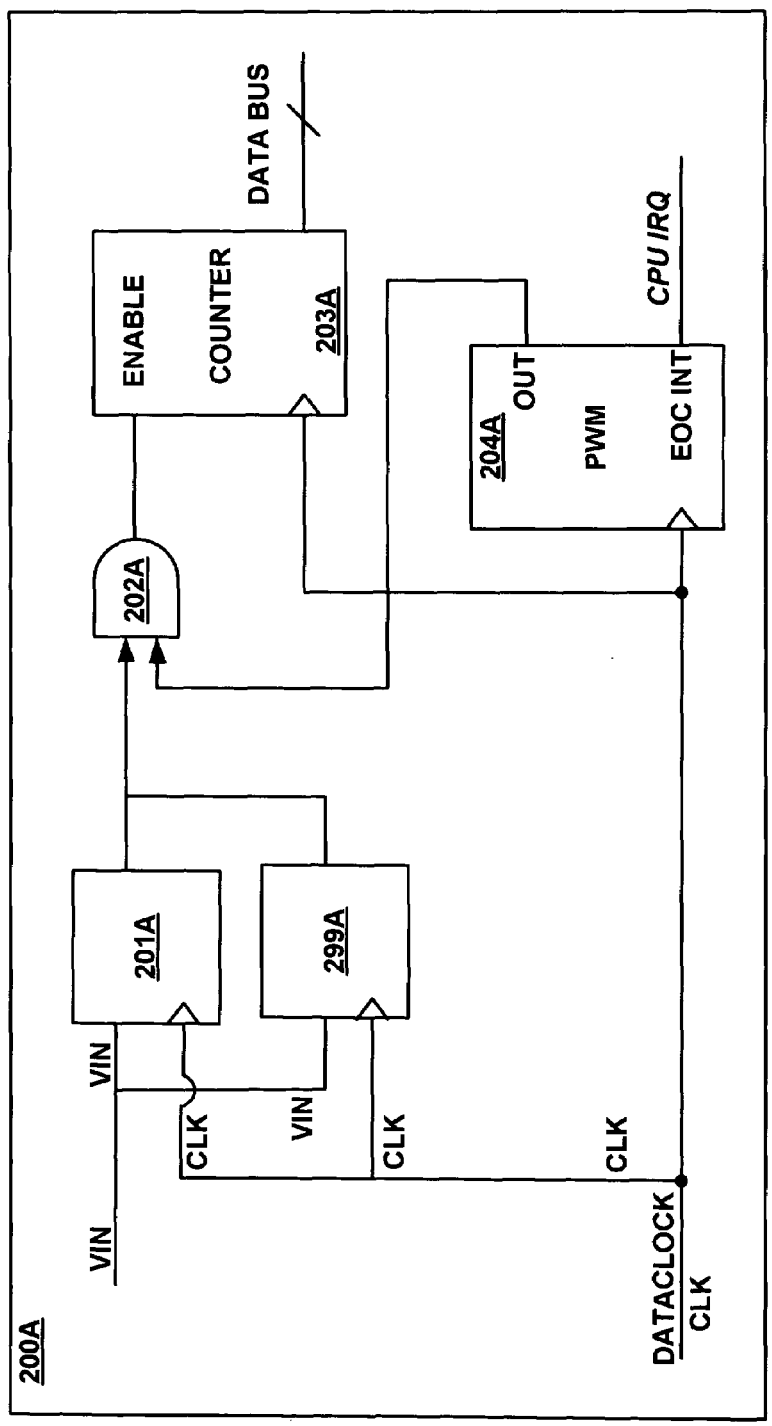
FIGS. 2A, 2B, and 2C depict exemplary ADCs having multiple integrators, according to one embodiment of the present invention.
Figure 4:
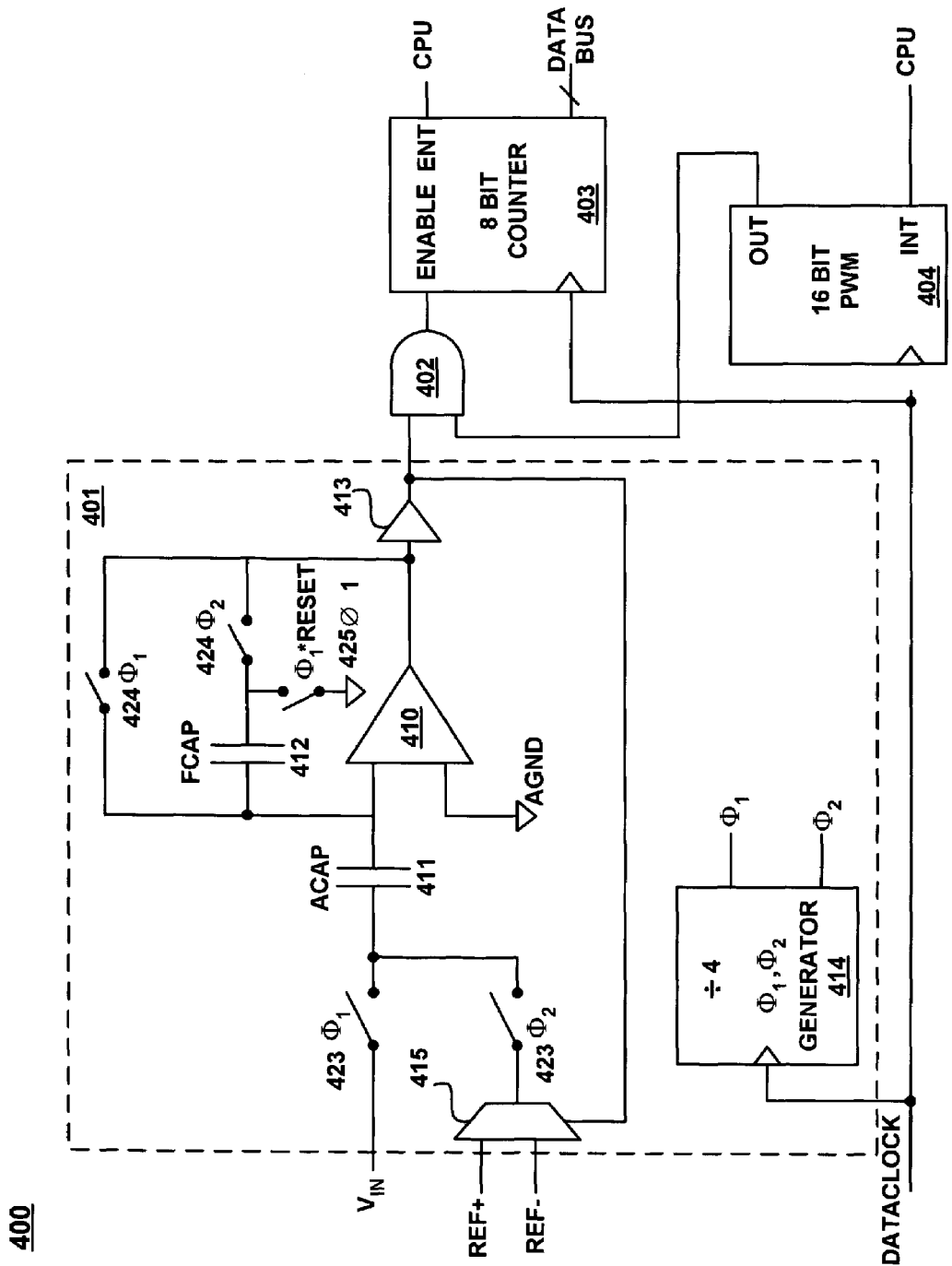
FIG. 4 depicts an exemplary ADC, according to one embodiment of the present invention.

FIG. 2A depicts an exemplary ADC 200A, according to another embodiment of the present invention. In both the structure and function, ADC 200A resembles ADC 100 (FIG. 1). However, instead of the single ADC integrator 101 of ADC 100, ADC 200A has two ADC integrators 201A and 299A, each providing outputs, either of which enable counter 203A through AND gate 202A. PWM 204A controls both the integrate time and the sample period of ADC 200A. In one embodiment, ADC integrators 201A and 299A function to integrate input voltage Vin into a digital pulse stream output, which provides one input to AND gate 202A through a buffer 413. In one embodiment, one or more of integrators 201A and 299A are configured from an integrating amplifier (e.g., integrating amplifier 410; FIG. 4) and a network of switched capacitors (e.g., input capacitor 411 and a feedback capacitor 412; FIG. 4). In other embodiments, for instance wherein one or more than two integrators (e.g., integrator 101 of FIG. 1; integrators 201B, 299B, 298B of FIG. 2B and/or integrators 201C, 299C, 298C, 297C of FIG. 2C) are used to configure an analog to digital converter such as ADC 200A, their outputs can also be so buffered.

Figure 2B:
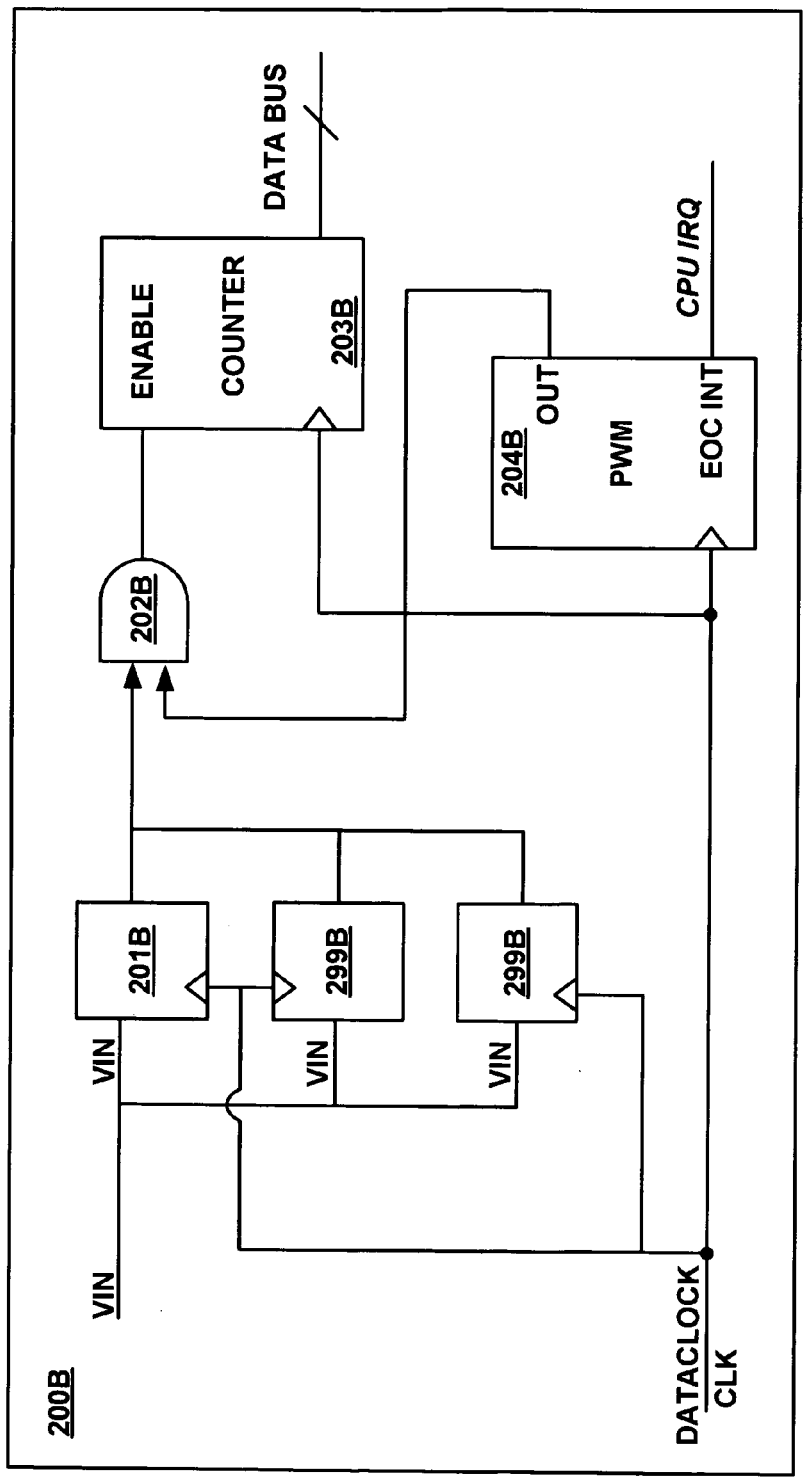

FIG. 2B depicts an exemplary ADC 200B, according to another embodiment of the present invention. In both the structure and function, ADC 200B resembles ADC 100 (FIG. 1). However, instead of the single ADC integrator 101 of ADC 100, ADC 200B has three ADC integrators 201B, 298B, and 299B, each providing outputs, any of which enable counter 203B through AND gate 202B. PWM 204B controls both the integrate time and the sample period of ADC 200B.

Figure 2C:
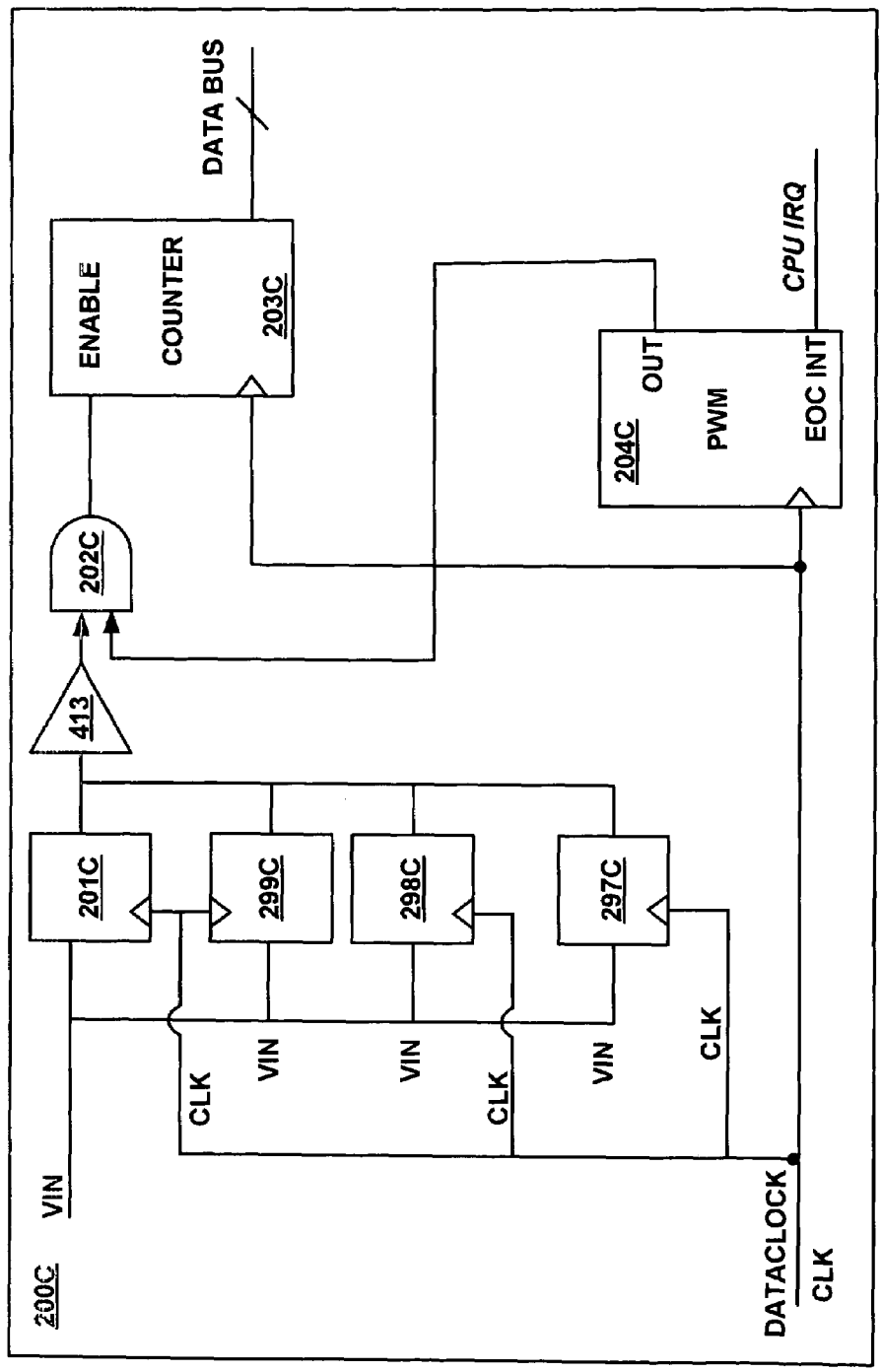

FIG. 2C depicts an exemplary ADC 200C, according to another embodiment of the present invention. In both the structure and function, ADC 200C resembles ADC 100 (FIG. 1). However, instead of the single ADC integrator 101 of ADC 100, ADC 200C has four ADC integrators 201C, 297C, 298C, and 299C, each providing outputs, either of which enable counter 203C through AND gate 202C. PWM 204C controls both the integrate time and the sample period of ADC 200C. It is appreciated that embodiments of the present invention are well suited to configure an ADC similar in structure and function to ADC 100 (and/or e.g., ADCs 200A–C) with any number of ADC integrators whose outputs can each enable an accumulating counter.

Exemplary Microcontroller

In one embodiment, an ADC converter may be configured from programmable/configurable components of a programmable microcontroller, such as is described in co-pending U.S. patent application Ser. No. 10/033,027 by Warren Snyder and entitled: Programmable Microcontroller Architecture (hereinafter Snyder), which was filed on Oct. 22, 2001, which is incorporated herein by reference in its entirety. In this embodiment, an ADC integrator (e.g., ADC integrator 101; FIG. 1) is configured from programmable elements of the microcontroller, such as the analog programmable system on a chip (PSoC™) components described in detail therein. Further, a programmable PWM and a counter (e.g., PWM 104, counter 103; FIG. 1) are configured from programmable elements of the microcontroller, such as the digital PSoC™ blocks described in detail therein.

Figure 3:
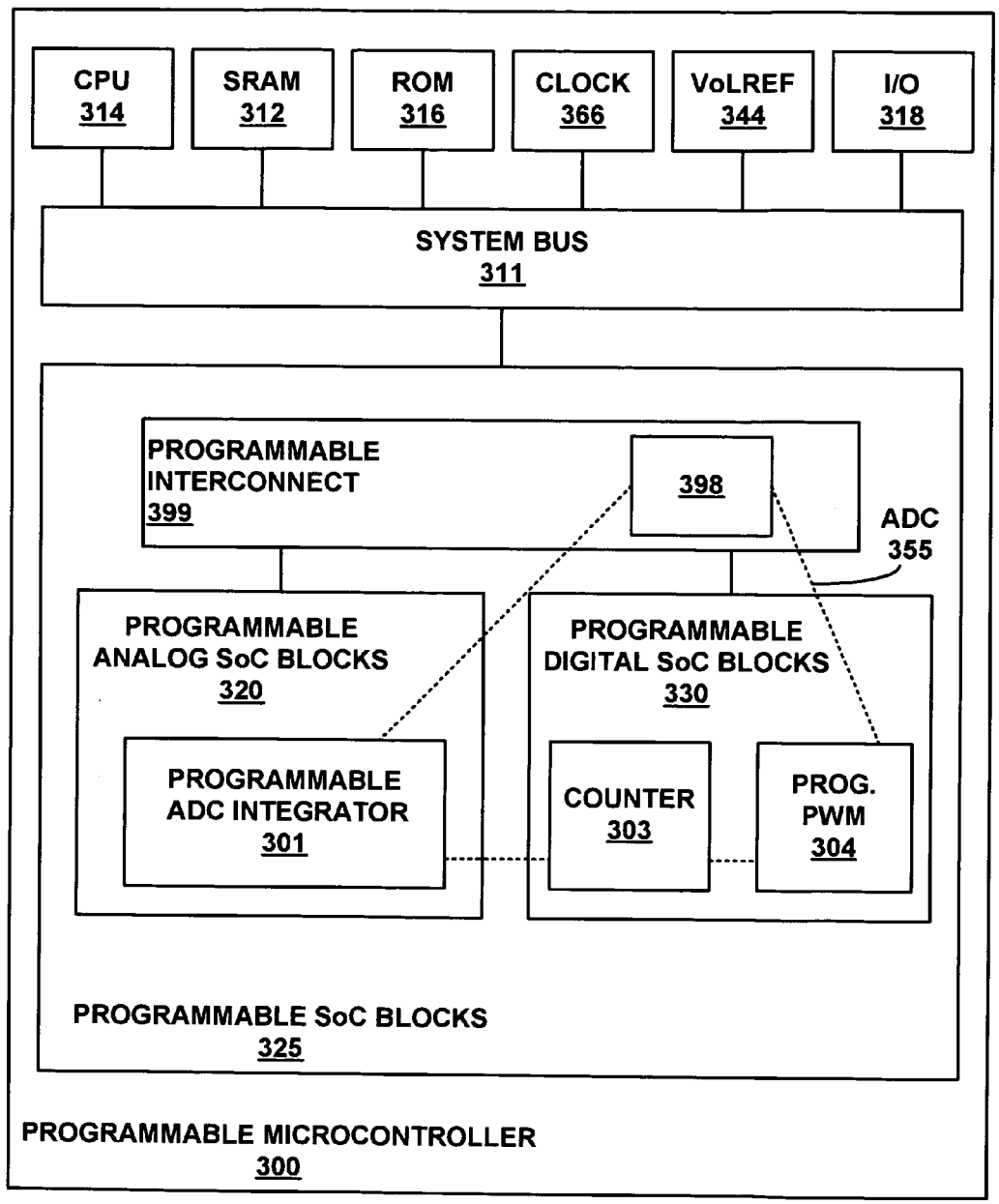
FIG. 3 depicts an exemplary microcontroller apparatus, according to one embodiment of the present invention.

FIG. 3 depicts an exemplary programmable microcontroller 300, according to one embodiment of the present invention. Programmable microcontroller 300 substantially conforms to the principles and characteristics of a microcontroller described in detail in the Snyder patent application, discussed above. Further, microcontroller 300 is programmable according to methods described in co-pending U.S. patent application Ser. Nos. 09/989,570, 09/989,571, and 09/989,808, all by M. Bartz, et al., and respectively entitled "Method for Facilitating Microcontroller Programming," "Method for Designing a Circuit for Programming Microcontrollers," and "Automatic Generation of Application Program Interfaces, Source Code, Interrupts, and Datasheets for Microcontroller Programming" all filed on Nov. 19, 2001, (hereinafter the Bartz patent applications), which are incorporated herein in their entirety by reference.

Programmable microcontroller 300 has a system bus 311 that intercouples a processor 314, a static random access memory (SRAM) 312, a flash read only memory (Flash ROM) 316, input/output (I/O) control 318, and programmable system on a chip (PSoC™) blocks 325, so as to allow electrical signals to flow from each of these components to others.

Processor 314 performs computational and other processing related functions and controls the operation of microcontroller 300. SRAM 312 provides memory space for the operations of processor 314. Flash ROM 316 provides a basic I/O system (BIOS) and other processor control routines to processor 314. I/O control 318 provides for interconnection between microcontroller 300 and the outside world, such as for sensing, communications, and programming of the microcontroller. A clock 366 provides timing signals (such as clock Clk; FIG. 1) for other components of microcontroller 300. A voltage reference module 344 provides reference voltages (such as Vref; FIG. 1) for other components of microcontroller 300.

PSoC™ blocks 325 include programmably versatile analog and digital system components that can be structured, changed, and intercoupled on-the-fly to comprise a variety of useful systems, sub-systems, and components for other systems. The analog components comprise programmable analog SoC™ blocks 320. The digital components comprise digital SoC™ blocks 330. The analog SoC™ blocks 320 and the digital SoC™ blocks 330 are interconnected by a programmable interconnect 399.

As depicted, analog SoC™ blocks 320 are programmed to configure a programmable ADC integrator 301. Digital SoC™ blocks are programmed to configure a counter 303 and a programmable PWM 304. Programmable interconnect 399 is programmed to configure connections 398 between ADC integrator 301, counter 303, programmable PWM 304 (and e.g., other components such as an AND gate, buffer, etc., configured from analog and digital SoC™ blocks 320 and 330).

Thus, an effective ADC 355 is programmably configured within microcontroller 300 from its various components. Programmable PWM 304 is programmed to control the integrate time and the sample period of ADC 355. Timing and voltage reference signals such as Clk and Vref (FIG. 1) are provided to ADC 355 via system bus 311 from clock 366 and voltage reference 344, respectively. Like other aspects of microcontroller 300, its components comprising ADC 355 therein are programmable on-the-fly by a user, e.g., via I/O pins 318 (or e.g., another interfacing mechanism such as a dedicated programming interface, represented herein by I/O pins 355).

Exemplary A/D Converter

FIG. 4 depicts an exemplary ADC 400, according to one embodiment of the present invention. A voltage Vin is supplied to an analog to digital conversion (ADC) modulator 401. In one embodiment, ADC modulator 401 functions as an analog modulator for integrating input voltage Vin into a digital pulse stream output, which provides one input to an AND gate 402 through a buffer 413. In one embodiment, ADC modulator 401 is configured from an integrating amplifier 410 and a network of switched capacitors, which include an input capacitor 411 and a feedback capacitor 412.

ADC modulator 401 is configured to function as a resetable integrator. Reference control multiplexer (MUX) 415 adds or subtracts reference voltage (e.g., adds a high reference Ref+ or a low reference Ref− from the input voltage Vin in response to the output polarity, such as at the output of buffer 413). Thus, MUX 415 functions as a voltage comparator for the output of ADC modulator 401 so as to pull the output back towards the integrating amplifier's ground, AGnd.

A single data clock Clk is provided to a counter 403, a PWM 404, and to an analog column clock 414. Analog column clock 414 generates from Clk two phase clocks ø1 and ø2, which are one fourth the frequency of Clk. Thus, PWM 404 and counter 403 run four times faster than the ADC modulator 401. Where N is the number of bits of resolution characterizing ADC 400, counter 403 accumulates N+2 bits of data. Phase clock ø1 clocks the conduction of switches 423ø1, 424ø1, and 425ø1. Phase clock ø2 clocks the conduction of switches 423ø2, and 425ø2.

Switches 423ø1, 423ø2, 424ø1, 424ø2, and 425ø1 in one embodiment may be complimentary metal oxide semiconductor (CMOS) or other transistors and their biasing circuits, biased (e.g., to conduct) according to their respective phase clocking. Switch 423ø1 conducts to couple Vin to the input capacitor 411. Switch 423ø2 conducts to couple Vref (e.g., the output of reference control MUX 415) to the input capacitor 411. When switch 423ø1 conducts, switch 423ø2 does not conduct.

Switch 424ø2 conducts to couple the output of integrating amplifier 410 to feedback capacitor 412. Switch 424ø1 conducts to couple the output of integrating amplifier 410 to the input of integrating amplifier 410, e.g., directly, bypassing feedback capacitor 412. When switch 424ø1 conducts, switch 424ø2 does not conduct. Switch 425ø1 conducts to discharge feedback capacitor 412 to ground, such that the switch functions as a reset. Switches 423ø1, 423ø2, 424ø1, 424ø2, and 425ø1 function to cause an operation of ADC modulator 401.

Pulse width modulator (PWM) 404 controls the integrate time and the sample period. PWM 404 is clocked by data clock Clk. While the output of the PWM 404 is in a high state, the ADC 400 is in the integrate mode accumulating the result. When the PWM 104 output goes low, an End Of Conversion (EOC) interrupt signal provides an interrupt request IRQ, e.g., for a processor. When the output of the PWM 404 returns high, it drives one of the AND gate 102 outputs high. This allows the digital pulse output of ADC 101 to drive the input of the counter 403. PWM 404 determines the integrate time of ADC modulator 401 and gates clock 402 into counter 403.

Counter 403 is clocked by data clock Clk and accumulates a result of each analog to digital conversion performed by ADC integrator 401, for instance accumulating the number of cycles that the output of ADC modulator 401 is positive. Counter 403 is read at the end of the integrate time, e.g., as determined by PWM 404, to provide a result, e.g., to a data bus. During each sample period, counter 403 is enabled by PWM 404 through AND gate 402 to count each pulse of the digital pulse output of ADC modulator 401, which is buffered by buffer 413 for counting (e.g., accumulation).

In one embodiment, counter 403 is a hardware based counter that accumulates a least significant byte (LSB). Counter 403 works, in this embodiment, with a software based counter, configured from code within a storage medium of a microcontroller configuring ADC 400 (e.g., registers comprising processor 314, microcontroller 300; FIG. 3), for receiving an overflow from said counter and incrementing a most significant byte (MSB) therefrom.

PWM 404 functions as a timer for controlling the period ADC modulator 401 spends integrating and for controlling the period counter 403 accumulates the digital pulse output therefrom. The PWM compare value period can be changed on-the-fly, as PWM 404 is adjustable on-the-fly to allow the sample period and the integrate time to be changed and independent of he data clock Clk. Allowing the sample period and integrate time to be adjustable on-the-fly by some integral number of clock pulses, the full scale value of ADC 400 may take advantage of adjustability.

In one embodiment, where ADC modulator 401 is operated a number of times equal to $2^N$ (e.g., to the number two, raised to a power equal to the number of bits characterizing the ADC) and the output voltage comparator (e.g., MUX 415) is positive a number p of those times, the residual voltage at the output of ADC 401 (e.g., at the output of buffer 413) is given by Equation 2, below, wherein 'FSC' relates to Full Scale Counts.

$$V_{resid} = FSC\ V_{in} - (pV_{Ref}) + V_{Ref}(FSC - p) \qquad \text{Equation 2}$$

Input voltage Vin is given by Equation 3, below.

$$V_{in} = \frac{V_{Ref}(p - FSC)}{FSC} + \frac{V_{Resid}}{FSC + 1} \qquad \text{Equation 3}$$

The range of ADC 400 in this embodiment is ±Vref and its resolution is given by the value of the least significant byte (LSB) counter 403 registers, which in the present embodiment is Vresid/FSC. In the present embodiment, residual voltage Vresid at the output of ADC modulator 401 at the end of a computation is less than Vref (e.g., Vresid≦Vref). Thus, Vresid/(FSC+1) is less than half a LSB and can effectively be ignored.

In one embodiment, ADC 400 is configured from components of a programmable microcontroller utilizing both analog and digital resources therein (e.g., programmable microcontroller 300, analog SoC™ blocks 320, digital SoC™ blocks 330; FIG. 3). Programmably, analog components configure ADC modulator 201 and digital components configure counter 203 and programmable PWM (pPWM) 204. In one such embodiment, counter 203 comprises an 8 bit counter and pPWM 204 comprises a programmable 16 bit PWM.

The interconnections between the respective components comprising ADC 400 within such a microcontroller, such as those intercoupling ADC modulator 401 and counter 404 and between counter 403 and pPWM 404, are programmably configured from a programmable interconnect intercoupling analog and digital components (e.g. connections 398, programmable interconnect 399; FIG. 3). The result of the ADC, e.g., the output of counter 403, is placed on a data bus to be read by other components, such as a processor (e.g., system bus 311, CPU 314; FIG. 3). The EOC IRQ generated by pPWM 404 is transmitted via this bus, or in another embodiment, by a separate bus.

In one such embodiment, counter 403 is implemented using a hardware component (e.g., an 8 bit counter) for the LSB and a software based counter component for the most significant byte. The software based component is implemented, for instance, by program code stored in a medium elsewhere within the microcontroller, such as the processor, ROM, etc. (e.g., CPU 314, Flash ROM 316; FIG. 3). A CPU interrupt is generated by counter 403 each time the hardware counter overflows. Responsive to this CPU interrupt, the upper MSB of the counter so implemented is incremented. Advantageously, combining software functionality with counter 403 in the present embodiment to so handle the MSB allows economizing on hardware resources; e.g., fewer digital resources may be needed to implement the hardware portion of counter 403.

The sample rate of ADC 400 is the number of the number of cycles of data clock Clk divided by the integrate time plus the time $T_{calc}$ required to calculate the result, and is given by Equation 4, below.

$$SampleRate = \frac{DataClk}{(FSC*4) + T_{Calc}} \qquad \text{Equation 4}$$

In one embodiment, the divisor (FSC*4)+$T_{calc}$ does not exceed $2^{16}-1$, or 65,535.

The time $T_{calc}$ needed to calculate the result is inversely proportional to the clock of the processor performing the calculations (e.g., CPU 314; FIG. 3). In one embodiment, results are calculated in 180 or more cycles of the processor clock and are expressed in terms of the data clock. This figure is exemplary and is used for illustrative purposes only; embodiments of the present invention are well suited to calculate results in other time periods. Further, one embodiment of the present invention changes $T_{calc}$ for instance by increasing $T_{calc}$ beyond the minimum, so as to optimize the sample rate, such as for a particular user application. The calculation time for the present embodiment is given by Equation 5, below.

$$T_{Calc} = \frac{DataClk}{Sample\_Rate} - FullScaleCount \qquad \text{Equation 5}$$

Figure 5:
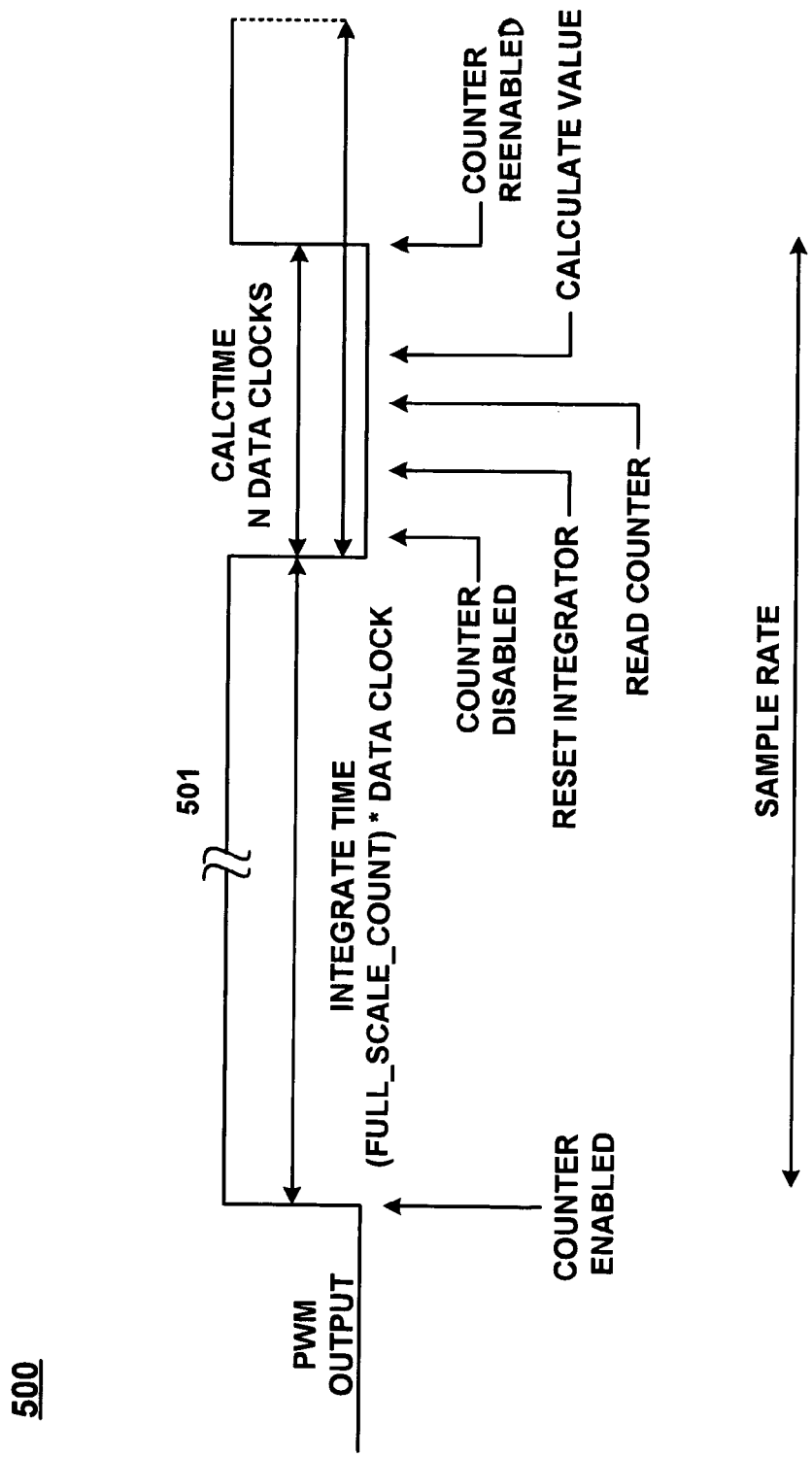
FIG. 5 depicts an exemplary data trace for the output of an ADC's Programmable pulse width modulator, according to the embodiment depicted in FIG. 4.

FIG. 5 depicts an exemplary data trace 500 for the output of an ADC's pPWM such as pPWM 404, according to the present embodiment. The 16 bit pPWM 404 is programmed to output a high signal that is some FSC*4 times the data clock Clk. The high pPWM output is shown by trace section 501. Thus for example, where the Full Scale Count (FSC) might be set to 2600, the pPWM 404 output remains high for 10400 (2600*4), periods of data clock Clk.

The output of the pPWM is then low for the time required to do the minimum result calculations and to reset the integrator plus what ever value is require to achieve the desired sample rate. The low time of the pPWM is also programmably adjustable, so as to help provide a more exact sample rate in combination with the data clock. The total period of the pPWM is the sum of the integrate time and $T_{calc}$, which gives the sample rate for the ADC.

Upon initiating a first reading, the PWM configuration is calculated, the integrator is reset, and the counter is reset. An initial delay of at least the calculation time then occurs. In the present embodiment, the PWM does not need to be initialized again after doing so prior to the first reading and once set (e.g., in registers of the PWM), the compare and period values do not have to be re-initialized, unless the resolution of calculation time is changed.

Exemplary Processes

Figure 6:
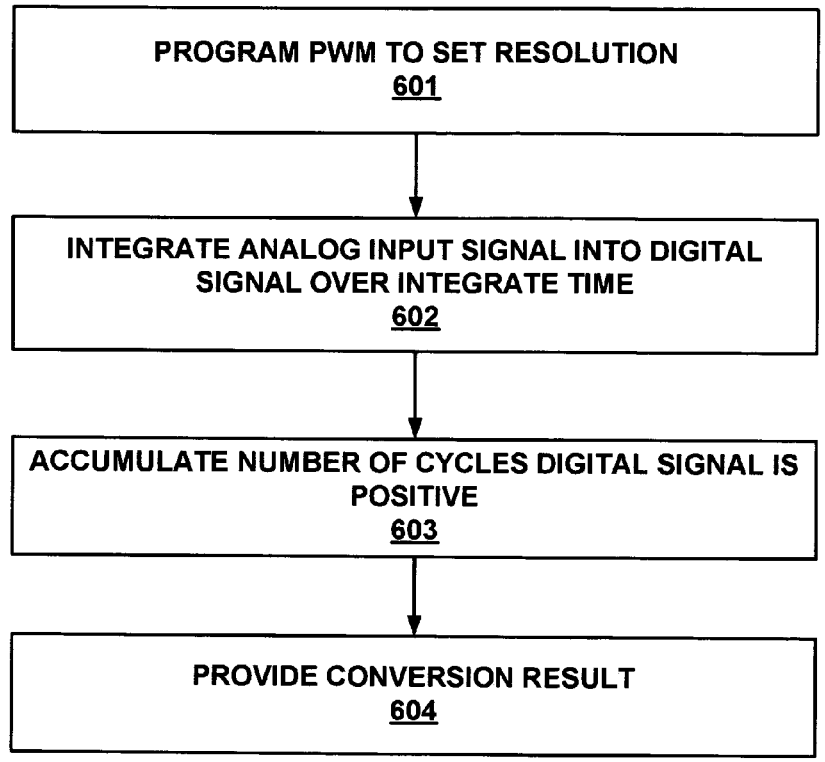
FIG. 6 is a flowchart of a process for performing an analog to digital conversion, according to one embodiment of the present invention.

FIG. 6 is a flowchart of a process 600 for performing an analog to digital conversion with continuously variable resolution, according to one embodiment of the present invention. Process 600 begins with step 601, wherein a pPWM is programmed to set the ADC resolution (e.g., set the integrate time and the sample period).

In step 602, an analog input signal is integrated over the integrate time into a digital signal, such as a digital pulse stream, which can be provided to a counter. In step 603, the number of cycles that the digital signal is positive (e.g., a logical one value) is accumulated (e.g., by the counter).

In step 604, the accumulated count is provided as a conversion result, completing process 600. Programming the ADC resolution using a pPWM can be done by a user on-the-fly, and advantageously obviates manual adjustment of the reference voltage for calibration of an ADC. Further, programming the ADC resolution using a pPWM, done by a user on-the-fly, advantageously allows setting a resolution for providing a convenient conversion result, which economizes on computational resources for handling the result. This can speed conversion and increase the sampling duty cycle of the ADC.

Figure 7:
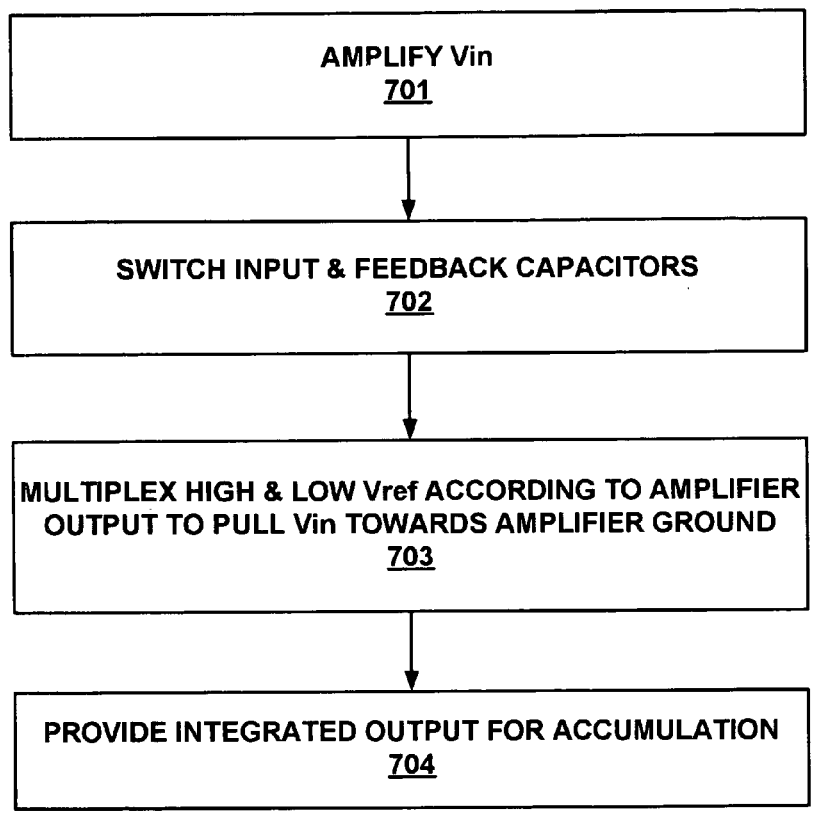
FIG. 7 is a flowchart of a process for integrating an analog signal into a digital signal, according to one embodiment of the present invention.

FIG. 7 is a flowchart of a process 700 for integrating an analog signal into a digital signal, according to one embodiment of the present invention. Process 700 begins with step 701, wherein an input voltage corresponding to an analog input is amplified.

In step 702, input and feedback capacitors associated with the amplifier are switched. In step 703, a high and a low reference voltage are multiplexed in response to the amplifier output, so as to pull Vin towards the amplifier ground.

In step 704, the integrated output is provided for accumulation (e.g., by a counter), completing process 700.

In summary, a circuit, method and microcontroller apparatus for performing an analog to digital conversion with continuously variable resolution is disclosed. The circuit of one embodiment has an integrating modulator for converting an analog input signal, corresponding to an input voltage, to a digital signal at its output over an integrate time. The circuit also has a counter with an enable input coupled to the integrating modulator output. The counter accumulates the number of cycles where the digital signal is positive during the sample period and provides a corresponding conversion result. The circuit further has a pulse width modulator. The output of this pulse width modulator gates a clock to the counter enable input. The pulse width modulator is user programmable on-the-fly to set said integrate time and the sample period, thus controlling the resolution of the analog to digital converter. In one embodiment, the circuit is configurable on-the-fly by programming components of a microcontroller.

Thus a circuit, method and microcontroller apparatus for performing an analog to digital conversion with continuously variable resolution has been described. While the present invention has been described in particular embodiments, it should be appreciated that the present invention should not be construed as limited by such embodiments, but rather construed according to the following claims and their equivalents.

What is claimed is:

1. A circuit for performing an analog to digital conversion with continuously variable resolution comprising:
   a integrating modulator having an input and an output, for converting an analog voltage signal at said input to a digital signal at said output over an integrate time;
   a counter having an enable input coupled to said integrating modulator output, for accumulating a number of cycles wherein said digital signal is positive during a sample period and for providing a corresponding conversion result; and
   a pulse width modulator having an output coupled to said counter enable input for gating a clock thereto and for measuring said integrate time, wherein said pulse width modulator is user programmable on-the-fly to set said integrate time and said sample period.

2. The circuit as recited in claim 1 further comprising a buffer coupled to said integrating modulator for buffering said integrating modulator output.

3. The circuit as recited in claim 1 further comprising a logical AND gate having a first input coupled to said integrating modulator output and a second input coupled to said pulse width modulator output and an output coupled to said counter enable input for coupling said integrating modulator and said pulse width modulator to said counter enable input wherein said counter is enabled to accumulate said conversion result when said integrating modulator output and said pulse width modulator output are both positive.

4. The circuit as recited in claim 1 wherein said integrating modulator, said counter and said pulse width modulator are programmably configured from components of a microcontroller, wherein said pulse width modulator is further for generating an interrupt request for a processor of said microcontroller, and wherein said interrupt request signals an end of said sample period.

5. A method for performing an analog to digital conversion with continuously variable resolution comprising:
   setting an integrate time and a sample period;
   integrating an analog voltage signal at an input into a digital signal at an output over said integrate time;
   accumulating a number of cycles wherein said digital signal is positive during a sample period; and
   providing a corresponding conversion result, wherein said setting is performed on-the-fly by programming a pulse width modulator having an output coupled to enable a counter performing said accumulating.

6. The method as recited in claim 5 further comprising buffering said digital signal for said accumulating.

7. The method as recited in claim 5 further comprising logically combining said digital signal and said pulse width modulator output by an AND operation to provide an enable signal for said counter.

8. The method as recited in claim 5 further comprising:
   programming a microcontroller on-the-fly to configure a circuit for performing said setting, said integrating, said accumulating and said providing a corresponding conversion result, wherein said corresponding conversion result is provided to a data bus coupling said circuit to a processor of said microcontroller; and
   providing an interrupt to signal an end of said sample period.

9. A microcontroller apparatus comprising:
   a bus;
   a processor coupled to said bus;
   a storage medium coupled to said bus for storing code to control said microcontroller; and
   a block of components coupled to said bus, wherein said block of components comprise:
      a programmable interconnect;
      a first plurality of programmable analog elements coupled to said programmable interconnect, for performing an analog operation; and
      a second plurality of digital elements coupled to said programmable interconnect, for performing a digital operation, wherein said block of components is programmable on-the-fly to configure a conversion circuit, said conversion circuit comprising an integrating modulator coupled to a counter and a pulse width modulator for performing an analog to digital conversion with continuously variable resolution.

10. The microcontroller apparatus as recited in claim 9 wherein said:
   integrating modulator converts an analog voltage signal at its input to a digital signal at its output over an integrate time wherein said integrating modulator is programmably configured from said programmable analog elements.

11. The microcontroller apparatus as recited in claim 10 wherein said hardware based counter accumulates a least significant bit, further comprising a software based counter configured from said code within said storage medium, for receiving an overflow from said counter and incrementing a most significant byte therefrom.

12. The microcontroller apparatus as recited in claim 9 wherein said conversion circuit further comprises a logical AND gate having a first input coupled to an output of said integrating modulator and a second input coupled to an output of said pulse width modulator and an output coupled to an input of said counter enable for coupling said integrating modulator and said pulse width modulator to said counter enable input wherein said counter is enabled to accumulate said conversion result when said integrator output and said pulse width modulator output are both positive.

13. The microcontroller apparatus as recited in claim 9 wherein said hardware based counter has an enable input coupled to an output of said integrating modulator wherein said counter functions to accumulate a number of cycles wherein said digital signal is positive during a sample period and to provide a corresponding conversion result.

14. The microcontroller apparatus as recited in claim 9 wherein said pulse width modulator has an output coupled to said hardware based counter enable input and functions to gate a clock thereto and for measuring said integrate time, wherein said pulse width modulator is user programmable on-the-fly to set said integrate time and said sample period and wherein said hardware based counter and said pulse width monitor are programmably configured from said digital elements.

* * * * *